United States Patent [19]

Takano et al.

[11] Patent Number: 5,212,151

[45] Date of Patent: May 18, 1993

[54] SUPERCONDUCTING THIN FILM HAVING A MATRIX AND FOREIGN PHASES

[75] Inventors: Satoshi Takano; Shigeru Okuda; Noriyuki Yoshida, all of Osaka; Tsukushi Hara, Tokyo; Kiyoshi Okaniwa, Tokyo; Takahiko Yamamoto, Tokyo, all of Japan

[73] Assignee: Sumitomo Electric Industries, Ltd., Osaka, Japan

[21] Appl. No.: 623,477

[22] Filed: Dec. 7, 1990

[30] Foreign Application Priority Data

Dec. 7, 1989 [JP] Japan .................................. 1-318252
Dec. 15, 1989 [JP] Japan .................................. 1-326727

[51] Int. Cl.$^5$ ............................................ H01L 39/00
[52] U.S. Cl. ........................................ 505/1; 505/701; 505/732; 428/930; 428/702; 427/62; 427/596
[58] Field of Search ............... 505/1, 732, 701, 780; 427/62, 531, 596; 428/702, 930

[56] References Cited

PUBLICATIONS

X. D. Wu et al., "Versatility of pulsed laser deposition technique for preparation of high Tc superconducting thin film" SPIE, vol. 948, High-Tc Superconductivity: Thin Films and Devices, Mar. 1988 Washington, US; pp. 50-65.
Yamane et al., "High Tc superconducting oxide films prepared by CVD", Adv. in Superconductivity II, (ISS'89) (Tokyo, Japan) Nov. 14-17, 1989 pp. 767-772.
Wu et al., "Large critical current densities in $YBa_2Cu_3O_{7-x}$ thin films made at high deposition rates", Appl. Phys. lett. 57(5) Jul. 1990, pp. 523-525.
Venkatesan et al., "High-temperature superconductivity in ultrathin films of $Y_1Ba_2Cu_3O_{7-x}$", Appl. Phys. lett. 54(6) Feb. 1989, pp. 581-583.
Roas et al., "Irradiation-induced enhancement of the critical current density of epitaxial $YBa_2Cu_3O_{7-x}$ thin films", Appl. Phys. lett. 54(11) Mar. 1989 pp. 1051-1053.
Singh et al., "Nature of epitaxial growth of high-Tc laser-deposted Y-Ba-Cu-O films on (100) Strontium titanate substrates" J. Apply. Phys. 67(8) Apr. 1990 pp. 3785-3790.

Primary Examiner—Shrive Beck
Assistant Examiner—Roy V. King
Attorney, Agent, or Firm—Pennie & Edmonds

[57] ABSTRACT

An oxide superconducting thin film formed by laser ablation comprises a matrix formed of c-axis oriented superconducting phases and foreign phases which are different in crystal orientation from the matrix. In order to improve critical current density of the oxide superconducting thin film, preferably selected are such conditions that the size of each superconducting phase in its a-b plane is not more than 0.1 μm in diameter, the size of each superconducting phase along its c-axis direction is equal to the thickness of the oxide superconducting thin film, the foreign phases at least partially pass through the oxide superconducting thin film along the direction of thickness, the size of each foreign phase is at least 0.01 μm and not more than 5 μm in diameter, each foreign phase has an a-axis or a c-axis perpendicularly oriented with respect to the major surface of the oxide superconducting thin film, and the like.

5 Claims, 2 Drawing Sheets

SUPERCONDUCTING THIN FILM HAVING A MATRIX AND FOREIGN PHASES

BACKGROUND OF THE INVENTION

1. Field of the Invention

The present invention relates to an oxide superconducting thin film, and more particularly, it relates to an oxide superconducting thin film which can attain high critical current density.

2. Description of the Background Art

In order to put an oxide superconductive material into practice, an appropriate substrate is prepared to form an oxide superconducting thin film on this substrate. A superconducting wire can be obtained by using a long substrate.

In general, a thin film is formed by a vapor phase method, for example, such as sputtering, vapor deposition, CVD, MBE or the like.

The practical use of an oxide superconductive material is hindered, however, on the ground that it is not so easy to attain high critical current density.

SUMMARY OF THE INVENTION

Accordingly, an object of the present invention is to provide an oxide superconducting thin film which can provide high critical current density.

The present invention is directed to an oxide superconducting thin film, which is formed by laser ablation. In order to solve the aforementioned technical problem, the inventive oxide superconducting thin film comprises a matrix formed of c-axis oriented superconducting phases and foreign phases which are different in crystal orientation from the matrix.

The inventors have made deep study as to improvement in critical current density of oxide superconducting thin films obtained by various vapor phase methods, to find that an oxide superconducting thin film having the aforementioned structure provides the most excellent critical current density. For example, it has been recognized that an oxide superconducting thin film substantially comprising only a matrix which is formed of c-axis oriented superconducting phases exhibits critical current density not more than 50% of that of the oxide superconducting thin film having the aforementioned structure. Thus, the aforementioned structure is an essential element for an oxide superconducting thin film which provides excellent critical current density.

An oxide superconducting thin film has an extremely complicated fine structure, which cannot be completely controlled. According to laser ablation, however, it is possible to considerably control such a fine structure of the oxide superconducting thin film by appropriately selecting film growing conditions. The inventors have found a fine structure which is more preferable for an oxide superconducting thin film through such control of the fine structure.

The following preferred modes or conditions of the present invention contribute to improvement in critical current density of the as-grown oxide superconducting thin film:

The size of each superconducting phase in its a-b plane is preferably not more than 0.1 $\mu$m in diameter. Further, the size of each superconducting phase along its c-axis is preferably equal to the thickness of the oxide superconducting thin film. In other words, the superconducting phase preferably passes through the oxide superconducting thin film along the direction of thickness.

The foreign phases which are different in crystal orientation from the c-axis oriented matrix preferably at least partially pass through the oxide superconducting thin film along the direction of thickness. The size of each foreign phase is preferably at least 0.01 $\mu$m and not more than 5 $\mu$m in diameter. Further, each foreign phase preferably has an a-axis or a b-axis which is vertically oriented with respect to the major surface of the oxide superconducting thin film.

In general, foreign phases which are prepared by a vapor phase method are of restricted types, and it is impossible to confirm an effect of an arbitrary foreign phase. In a useful foreign phase, however, Cu occupies at least 60 atomic percent among all metal elements contained therein. Further, it is particularly preferable that the foreign phases are partially formed of CuO particles.

A preferred embodiment of the present invention includes a single-crystal type matrix, or a matrix having parts which are different in a-b axis orientation from other portions.

In this specification, the term "single crystal" is widely defined to include a twin crystal.

According to the present invention, it is possible to obtain an oxide superconducting thin film having high critical current density, as understood from Examples described below.

The oxide superconducting thin film according to the present invention is grown by laser ablation, whereby the film deposition rate is increased as compared with that grown by another vapor phase method, and the film can be grown in an atmosphere under a high pressure. Thus, it is possible to obtain an oxide superconducting thin film having a dense structure, and its critical current density can be improved also in this point.

These and other objects, features, aspects and advantages of the present invention will become more apparent from the following detailed description of the present invention when taken in conjunction with the accompanying drawings.

DESCRIPTION OF THE PREFERRED EMBODIMENTS

EXAMPLE 1

A KrF excimer laser of 248 nm was used to form a Y-Ba-Cu-O film on an MgO(100) substrate. The film was grown using a target composed of Y, Ba and Cu in the ratios 1:2:3, under conditions of oxygen gas pressure of 100 mTorr, substrate-to target distance of 40 mm, laser energy density of 2 J/cm$^2$, laser repetition rate of 3 Hz and substrate temperature of 750° C. for one hour.

Thus, a Y-Ba-Cu-0 film of 500 Å in thickness was obtained.

As the result of a four-probe method, this film exhibited a critical temperature Tc of 90.5K and critical current density Jc of $6.0 \times 10^6$ A/cm$^2$ at 77.3K. It has been impossible to attain such high critical current density in other thin film growing methods such as sputtering, MBE and the like.

Figure 1:
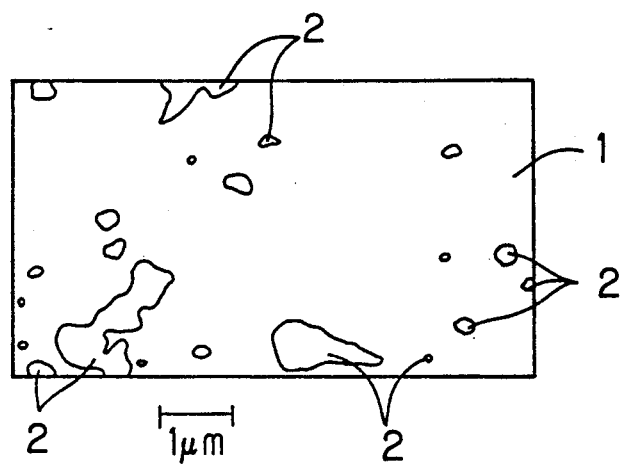
FIG. 1 is an enlarged view showing the surface of an oxide superconducting thin film obtained according to Example 1 of the present invention.

The surface of the oxide superconducting thin film was observed to find that foreign phases 2 of at least 0.01 μm and not more than 5 μm in diameter were dispersed in a matrix 1 which was formed of superconducting phases, as shown in FIG. 1. The different phases 2 were partially composed of Cu-O.

Figure 2:
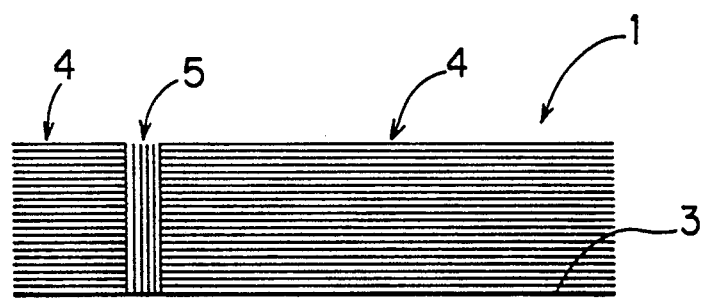
FIG. 2 illustrates the crystal structure of a matrix 1 of the oxide superconducting thin film shown in FIG. 1.

FIG. 2 shows crystal orientation of the matrix 1. In this figure, the lines show a-b planes, and c-axes are perpendicular to the a-b planes.

Referring to FIG. 2, the matrix 1 was mostly formed of c-axis oriented parts 4 whose a-b planes were oriented in parallel with a major surface of the superconducting thin film, i.e., a substrate surface 3. This matrix 1 was provided with a foreign phase 5, which was different in crystal orientation from the c-axis oriented parts 4. This foreign phase 5 had an a-axis or a b-axis which was oriented perpendicularly to the major surface of the superconducting thin film, i.e., the substrate surface 3.

The foreign phase 5 of different crystal orientation was composed of Y, Ba and Cu in the ratios 1:2:3, similarly to the c-axis oriented parts 4.

Figure 3:
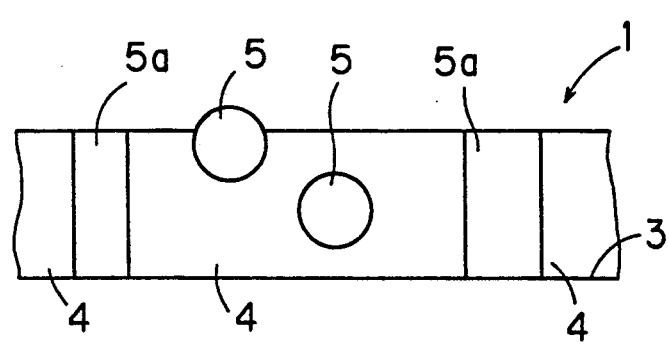
FIG. 3 is an illustrative sectional view showing a state of distribution of foreign phase 5 and 5a which are different in crystal orientation from c-axis oriented parts 4 in the matrix 1 shown in FIG. 2.

FIG. 3 shows a section of the superconducting thin film. As understood from FIG. 3, such foreign phases 5 of different crystal orientation were distributed in various modes with respect to the direction of thickness of the superconducting thin film, and some foreign phases 5a passed through the superconducting thin film along the direction of thickness.

REFERENCE EXAMPLE 1

An oxide superconducting film was obtained through a similar process to Example 1, excepting that the substrate temperature was 800° C.

In the as-formed oxide superconducting thin film, CuO particles of at least 7 μm in diameter were observed. Further, it was proved that the matrix was entirely c-axis oriented perpendicularly to the substrate surface. This oxide superconducting thin film exhibited critical current density Jc of $1.2 \times 10^6$ A/cm$^2$ at 77.3K.

EXAMPLE 2

A KrF excimer laser of 248 nm was used to form a Y-Ba-Cu-O film on an MgO(100) substrate. The film was formed using a target composed of Y, Ba and Cu in the ratios 1:2:3 under conditions of oxygen gas pressure of 200 mTorr, substrate-to-target distance of 60 mm, laser energy density of 2.5 J/cm$^2$, laser repetition rate of 40 Hz, substrate temperature of 700° C., and film deposition rate of 2500 Å/min. for four minutes.

The aforementioned film deposition rate is extremely high as compared with a condition of 12 to 60 Å/min., which is known as being capable of obtaining an oxide superconducting thin film having relatively high critical current density by RF sputtering.

The surface of the as-grown oxide superconducting thin film was observed with a scanning electron microscope, to prove that it was formed of particles of 0.005 to 0.1 μm in particle size. As to X-ray diffraction, no diffraction but (001) was observed and it was ascertained that this film was c-axis oriented. Through refraction high-energy electron beam diffraction, a ring-shaped diffraction pattern was observed above the oxide superconducting thin film, which was determined as being polycrystalline. As the result of observation with a transmission electron microscope, it was proved that the film was mostly formed of superconducting phase particles which were uniformly oriented along a-b directions, and partially formed of superconducting phase particles which were different in orientation along a-b directions from the uniformly oriented particles.

Figure 4:
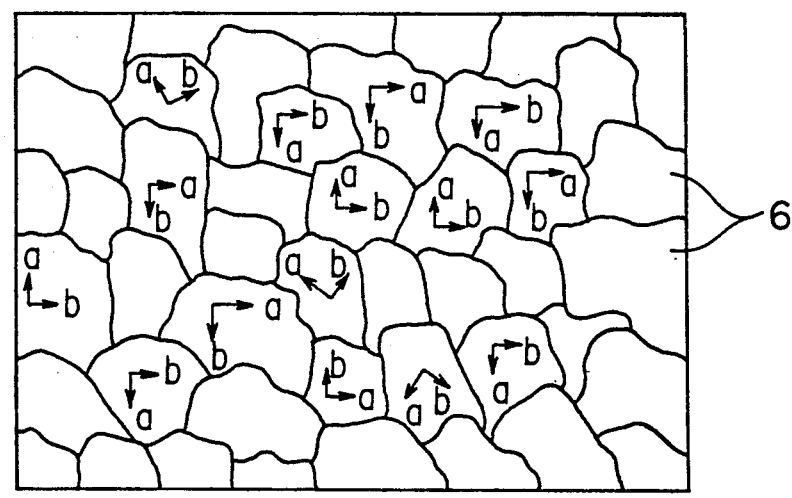
FIG. 4 is an enlarged view showing an estimated surface state of an oxide superconducting thin film obtained according to Example 2 of the present invention.

FIG. 4 shows a structure, estimated from the above results of analysis, of the superconducting thin film. Referring to FIG. 4, numeral 6 denotes superconducting phase particles.

Critical current density Jc of this film was measured by a four-probe method. The result was $2.2 \times 10^6$ A/cm$^2$ at 77.3K.

REFERENCE EXAMPLE 2

Oxide superconducting thin films were obtained through a process similar to Example 2, excepting that the substrate temperatures were 600° C. and 750° C.

These oxide superconducting thin films were observed with a scanning electron microscope, to prove that the thin film prepared at the substrate temperature of 600° C. was formed of particles of 0.001 to 0.005 μm in particle size and that prepared at 750° C. was formed of particles of 0.05 to 1.1 μm in particle size.

As to critical current density Jc, the former film exhibited $8.8 \times 10^5$ A/cm$^2$ at 77.3K, and the latter film exhibited $4.3 \times 10^5$ A/cm$^2$ at 77.3K.

Although the present invention has been described and illustrated in detail, it is clearly understood that the same is by way of illustration and example only and is not to be taken by way of limitation, the scope of the present invention being limited only by the terms of the appended claims.

What is claimed is:

1. An Y-Ba-Cu-O superconducting film formed by laser ablation on a single crystal substrate comprising:
   a matrix formed of c-axis oriented superconducting phases, wherein the size of each said superconducting phase in its c-axis direction is equal to the thickness of said superconducting film; and
   foreign phases comprising CuO particles, wherein the size of each said foreign phase is at least 0.01 μm and not more than 5 μm in diameter and each said foreign phase other than said CuO particles has an a-axis or b-axis oriented perpendicularly with respect to the major surface of said oxide superconducting film.

2. An Y-Ba-Cu-O superconducting film in accordance with claim 1, wherein the size of each said superconducting phase in its a-b plane is not more than 0.1 μm in diameter.

3. An Y-Ba-Cu-O superconducting film in accordance with claim 1, formed on a MgO(100) substrate.

4. An Y-Ba-Cu-O conducting film in accordance with claim 1, wherein said matrix has parts being different in orientation along a-b directions from other parts.

5. An Y-Ba-Cu-O superconducting film formed by laser ablation on a single crystal substrate, comprising
   a matrix of c-axis oriented superconducting phases, wherein the size of each said superconducting phase in its c-axis direction is equal to the thickness of said superconducting film, and
   foreign phases, wherein the size of each said foreign phase is at least 0.01 μm not more than 5 μm in diameter and said foreign phase comprises at least Cu, and Cu occupies at least 60 atomic percent among all metal elements contained in said foreign phase.

* * * * *